United States Patent
Soneda et al.

(10) Patent No.: US 11,264,245 B2
(45) Date of Patent: Mar. 1, 2022

(54) METHOD FOR MANUFACTURING SEMICONDUCTOR DEVICE

(71) Applicant: Mitsubishi Electric Corporation, Tokyo (JP)

(72) Inventors: Shinya Soneda, Tokyo (JP); Kenji Harada, Tokyo (JP); Yosuke Nakata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/166,265

(22) Filed: Oct. 22, 2018

(65) Prior Publication Data

US 2019/0228974 A1    Jul. 25, 2019

(30) Foreign Application Priority Data

Jan. 19, 2018    (JP) .............................. JP2018-007227

(51) Int. Cl.
*H01L 21/288* (2006.01)
*H01L 23/00* (2006.01)
(Continued)

(52) U.S. Cl.
CPC .......... *H01L 21/288* (2013.01); *C23C 18/165* (2013.01); *C23C 18/1637* (2013.01);
(Continued)

(58) Field of Classification Search
CPC ..................................................... H01L 21/288
See application file for complete search history.

(56) References Cited

U.S. PATENT DOCUMENTS

2015/0162358 A1* 6/2015 Inoue .................. H01L 27/1262
 257/43
2015/0235925 A1    8/2015 Nakata et al.
(Continued)

FOREIGN PATENT DOCUMENTS

DE    11 2015 006 472 T5    12/2017
JP    H07-086703 A    3/1995
(Continued)

OTHER PUBLICATIONS

An Office Action issued by the German Patent Office dated May 31, 2020, which corresponds to German Patent Application No. 102018221485.9 and is related to U.S. Appl. No. 16/166,265; with English language translation.

(Continued)

*Primary Examiner* — Mohammad M Choudhry
(74) *Attorney, Agent, or Firm* — Studebaker & Brackett PC

(57) ABSTRACT

Provided is a method for manufacturing a semiconductor device that improves the reliability of the semiconductor device under thermal stress and the assembly performance of the semiconductor device in manufacturing steps. The method includes the following: forming a first electrode by depositing a first conductive film onto one main surface of a semiconductor substrate and patterning the first conductive film; forming a first metal film corresponding to a pattern of the first electrode onto the first electrode; forming a second electrode by depositing a second conductive film onto the other main surface of the semiconductor substrate; forming a second metal film thinner than the first metal film onto the second electrode; and collectively forming a third metal film onto each of the first metal film and the second metal film by electroless plating.

5 Claims, 8 Drawing Sheets

(51) Int. Cl.
*C23C 18/16* (2006.01)
*C23C 18/31* (2006.01)
*C23C 18/32* (2006.01)

(52) U.S. Cl.
CPC .............. *C23C 18/31* (2013.01); *C23C 18/32* (2013.01); *H01L 24/03* (2013.01); *H01L 2924/13055* (2013.01); *H01L 2924/13091* (2013.01); *H01L 2924/351* (2013.01)

(56) References Cited

U.S. PATENT DOCUMENTS

| 2016/0027662 | A1* | 1/2016 | Soeno | H01L 21/78 |
| | | | | 438/460 |
| 2017/0207180 | A1* | 7/2017 | Arai | H01L 23/562 |
| 2018/0033694 | A1 | 2/2018 | Ueno et al. | |
| 2018/0114766 | A1 | 4/2018 | Nakata | |
| 2018/0138135 | A1 | 5/2018 | Sunamoto et al. | |

FOREIGN PATENT DOCUMENTS

| JP | 2007-087983 A | | 4/2007 |
| JP | 2013-194291 A | | 9/2013 |
| JP | 2016-048760 A | | 4/2016 |
| JP | WO 2016/163319 | * | 10/2016 |
| JP | 6250868 B2 | | 12/2017 |
| WO | 2014/037996 A1 | | 3/2014 |
| WO | 2016/189643 A1 | | 12/2016 |

OTHER PUBLICATIONS

An Office Action; "Notice of Reasons for Refusal", by the Japanese Patent Office dated Jun. 1, 2021, which corresponds to Japanese Patent Application No. 2018-007227 and is related to U.S. Appl. No. 16/166,265; with English language translation.

* cited by examiner

METHOD FOR MANUFACTURING SEMICONDUCTOR DEVICE

BACKGROUND OF THE INVENTION

Field of the Invention

The present invention relates to a method for manufacturing a semiconductor device.

Description of the Background Art

International Publication No. 2014/037996 or Japanese Patent Application Laid-Open No. 2016-48760 discloses a semiconductor device that includes a metal film on a front-surface electrode (an anode electrode on an upper surface in Japanese Patent Application Laid-Open No. 2016-48760) in order to directly join an external electrode to an electrode of a semiconductor element with solder. The semiconductor device with such a configuration achieves wiring in which a large current flows through the semiconductor device along with low electrical resistance.

A portion where a current flows through a semiconductor element receives a thermal stress resulting from temperature cycles. Under the thermal stress, a metal film advances into an alloy of metal and solder, thus decreasing the thickness of the metal film. To enhance the reliability of the junction between electrodes, the metal film needs to be designed so as not to vanish under conditions where a semiconductor device is used. Hence, a semiconductor device needs to be designed so as to include a metal film that is thick enough to not vanish in a use requiring resistance to a severe thermal stress. Plating rather than sputtering is suitable for forming such a thick metal film.

In the semiconductor device in International Publication No. 2014/037996 or Japanese Patent Application Laid-Open No. 2016-48760, the metal film is formed on only the front-surface electrode that is exposed to an opening of a protective film through plating. To address the aforementioned problem under the thermal stress, another thick metal film needs to be formed on the back surface as well. Japanese Patent No. 6250868 proposes a semiconductor element including a plated layer formed on each of a front-surface electrode and a back-surface electrode. Plating simultaneously forms metal films on both surfaces of a semiconductor device. Without a special process, however, metal films having almost the same thickness are formed on the individual surfaces. Hence, the metal film on the entire back surface has a stronger stress than the metal film on the front surface formed correspondingly to a region where the front-surface electrode is exposed. The stronger stress presumably warps the semiconductor device so as to bulge toward its front surface, i.e., so as to have an upwardly bulging shape. In particular, a metal film formed through plating requires a heat treatment for gas exhaust before it is soldered to an external electrode. The aforementioned stress is presumed to cause warpage during the heat treatment. When the back-surface electrode is soldered to the external electrode with the semiconductor device warping in bulge form, the bulge tends to have a void resulting from soldering, thus causing assembly failures. The warpage in bulge form is caused mainly by the aforementioned difference in stress, i.e., a difference in volume between the metal films. It is difficult to establish a difference in thickness between the metal films while simultaneously forming the metal films on both surfaces through plating alone. Japanese Patent No. 6250868 proposes a method for manufacturing a semiconductor element, the method controlling the speed of forming the plated layers on the front and back surfaces of the semiconductor element using a difference in area between the front-surface electrode and the back-surface electrode. However, the areas of the electrodes are parameters associated with semiconductor element design per se. Accordingly, a manufacturing method is required that improves the productivity of the semiconductor element as well as the flexibility of semiconductor element design.

A structure in which an end of the metal film is covered with the protective film, as disclosed in International Publication No. 2014/037996, cannot be made when the metal film is formed in the opening of the protective film.

SUMMARY

To solve the above problems, it is an object of the present invention to provide a method for manufacturing a semiconductor device, the method improving the reliability of the semiconductor device under thermal stress, and at the same time, improving the design flexibility of the semiconductor device and the productivity of the semiconductor device in manufacturing steps.

A method for manufacturing a semiconductor device in the Specification includes the following: forming a first electrode by depositing a first conductive film onto one main surface of a semiconductor substrate and patterning the first conductive film; forming a first metal film corresponding to a pattern of the first electrode onto the first electrode; forming a second electrode by depositing a second conductive film onto the other main surface of the semiconductor substrate; forming a second metal film thinner than the first metal film onto the second electrode; and collectively forming a third metal film onto each of the first metal film and the second metal film through electroless plating.

The method for manufacturing the semiconductor device in the Specification improves the reliability of the semiconductor device under the thermal stress, and at the same time, improving the design flexibility of the semiconductor device and the productivity of the semiconductor device in the manufacturing steps.

These and other objects, features, aspects and advantages of the present invention will become more apparent from the following detailed description of the present invention when taken in conjunction with the accompanying drawings.

DESCRIPTION OF THE PREFERRED EMBODIMENTS

The following describes preferred embodiments of a method for manufacturing a semiconductor device.

First Preferred Embodiment (Configuration of Semiconductor Device)

Figure 1:
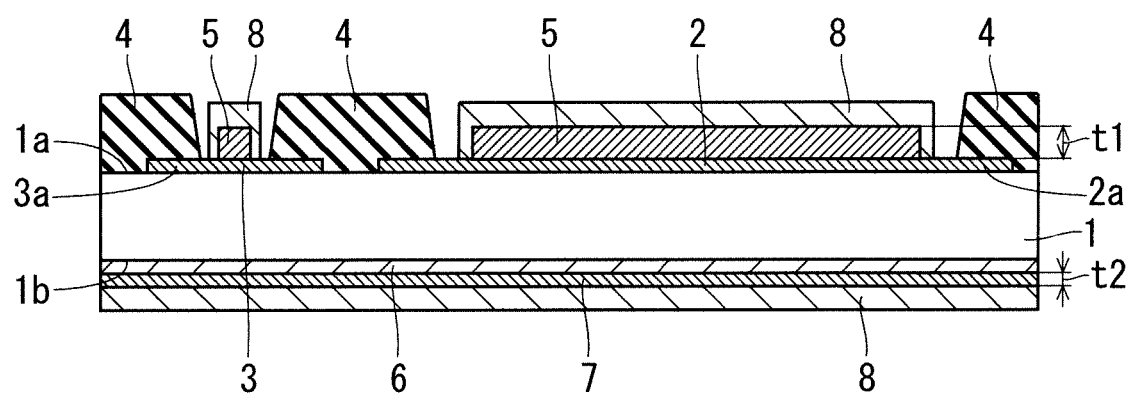
FIG. 1 is a cross-sectional view of the configuration of a semiconductor device according to a first preferred embodiment.

FIG. 1 is a cross-sectional view of the configuration of a semiconductor device according to a first preferred embodiment. The semiconductor device includes a semiconductor substrate 1, a first electrode 2, a third electrode 3, a protective film 4, a first metal film 5, a second electrode 6, a second metal film 7, and third metal films 8.

The semiconductor substrate 1 is provided with a switching element (not shown), which is a semiconductor element. An example of the semiconductor element is a power semiconductor element. Examples of the power semiconductor element include a metal-oxide-semiconductor field-effect transistor (MOSFET) including a wide-bandgap semiconductor, and an insulated gate bipolar transistor (IGBT). An example of the semiconductor device is a power semiconductor device including the power semiconductor element.

The first electrode 2 is disposed on a front surface 1a of the semiconductor substrate 1, i.e., one main surface of the semiconductor substrate 1, so as to have a predetermined pattern. The first electrode 2 is an electrode for supplying a main current through the semiconductor element, and is, for instance, a source electrode of the MOSFET or an emitter electrode of the IGBT. The first electrode 2 is an Al alloy containing materials, such as Al, Si, and Cu. The first electrode 2 has a thickness of, for instance, the order of 0.1 to 5 μm.

The third electrode 3 is disposed on the front surface 1a, that is, the one main surface of the semiconductor substrate 1 so as to be spaced from the first electrode 2. The third electrode 3 is an electrode to which a voltage signal for controlling the switching operations of the semiconductor element is applied, and is, for instance, a gate electrode of the MOSFET or the IGBT.

The protective film 4 is disposed on the front surface 1a of the semiconductor substrate 1 so as to cover an end 2a of the pattern of the first electrode 2. The protective film 4 has an opening formed by covering the end 2a of the first electrode 2. The first electrode 2 is partly exposed from this opening. The protective film 4 is also disposed at an end 3a of a pattern of the third electrode 3. The protective film 4 has an opening formed by covering the end 3a of the third electrode 3. The third electrode 3 is partly exposed from this opening. An example of the protective film 4 is a polyimide insulating film.

The first metal film 5 is disposed on the first electrode 2 exposed from the opening of the protective film 4. That is, the first metal film 5 is provided so as to correspond to the pattern of the first electrode 2. The first metal film 5 is also disposed on the third electrode 3 exposed from the opening of the protective film 4. That is, the first metal film 5 is provided so as to correspond to the pattern of the third electrode 3. The first metal film 5 is a metal film for soldering. The first metal film 5 contains, for instance, Ni or Cu.

The second electrode 6 is disposed on a back surface 1b of the semiconductor substrate 1, i.e., the other main surface of the semiconductor substrate 1. In the first preferred embodiment, the second electrode 6 has a larger area than the first electrode 2, and is herein disposed all over the back surface 1b. The second electrode 6 is an electrode for supplying the main current through the semiconductor element, and is, for instance, a drain electrode of the MOSFET or a collector electrode of the IGBT. The second electrode 6 is an Al alloy containing materials, such as Al, Si, and Cu. The second electrode 6 has a thickness of, for instance, the order of 0.1 to 5 μm.

The second metal film 7 is disposed on the second electrode 6. The second metal film 7 is a metal film for soldering. The second metal film 7 contains, for instance, Ni or Cu. The thickness, t1, of the first metal film 5 and the thickness, t2, of the second metal film 7 establish a relationship of t1>t2.

The individual third metal films 8 are disposed on the first metal film 5 and the second metal film 7. The third metal films 8 contain, for instance, Ni or Cu. The third metal films 8 may contain P or Au.

(Method for Manufacturing Semiconductor Device)

Figure 2:
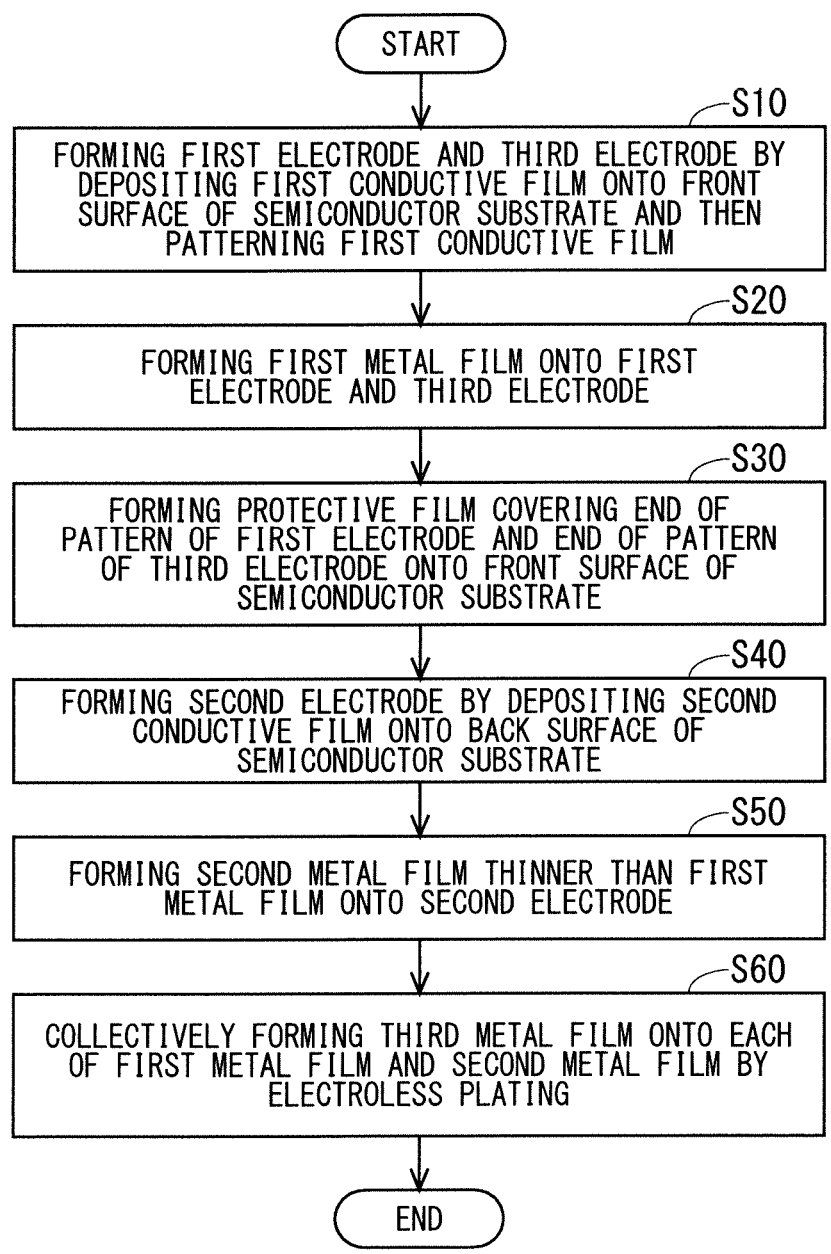
FIG. 2 is a flowchart showing a method for manufacturing the semiconductor device according to the first preferred embodiment.

The following describes a method for manufacturing the semiconductor device according to the first preferred embodiment. FIG. 2 is a flowchart showing the method for manufacturing the semiconductor device according to the first preferred embodiment.

Step S10 is forming the first electrode 2 and the third electrode 3 spaced from the first electrode 2 by depositing a first conductive film onto the front surface 1a, that is, the one main surface of the semiconductor substrate 1 and then patterning the first conductive film. For instance, the first conductive film is firstly deposited onto the front surface 1a of the semiconductor substrate 1. The first conductive film is formed through, for instance, vapor deposition or sputtering. Herein, the first conductive film is an Al-containing film. The first conductive film undergoes patterning through photolithography. This forms the first electrode 2 and the third electrode 3 that contain Al and have predetermined patterns.

Step S20 is forming the first metal film 5 corresponding to the pattern of the first electrode 2 onto the first electrode 2, and forming the first metal film 5 corresponding to the pattern of the third electrode 3 onto the third electrode 3. For instance, a first metal material is deposited onto the front surface 1a of the semiconductor substrate 1 through vapor deposition or sputtering, and undergoes patterning through photolithography and etching. Alternatively, after undergoing patterning through photolithography, the first metal material is deposited onto the front surface 1a of the semiconductor substrate 1 through vapor deposition or sputtering; moreover, the first metal films 5 corresponding to the patterns are formed through lift-off. Here, the first metal material is Ni, and the first metal film 5 is a Ni film.

Step S30 is forming the protective film 4 covering the end 2a of the pattern of the first electrode 2 and the end 3a of the pattern of the third electrode 3 onto the front surface 1a of the semiconductor substrate 1. For instance, an insulating film of polyimide and other materials undergoes patterning through photolithography. At this time, the insulating film undergoes patterning so that the first electrode 2 and the third electrode 3 are exposed from the respective openings of the protective film 4 located inside the end 2a of the first electrode 2 and the end 3a of the third electrode 3. This forms the protective film 4. It is noted that step S20 and step S30 may be reversed.

Step S40 is forming the second electrode by depositing a second conductive film onto the back surface 1b, that is, the other main surface of the semiconductor substrate 1. The second conductive film is deposited through, for instance, vapor deposition or sputtering. Herein, the second conductive film is an Al-containing film. This step forms the second electrode 6 containing Al.

Step S50 is forming the second metal film 7 thinner than the first metal film 5 onto the second electrode 6. For instance, a second metal material is deposited onto the second electrode 6 through vapor deposition or sputtering to form the second metal film 7. Here, the second metal material is Ni, and the second metal film 7 is a Ni film. The thickness t2 of the second metal film 7 is regulated according to the area, that is, rate of opening of the protective film 4 where the first metal film 5 is formed. In other words, the thickness of the second metal film 7 in film formation is regulated according to the volume of the first metal film 5. It is noted that the thickness of the first metal film 5 may be regulated, in step S20, with the thickness of the second metal film 7 fixed.

Step S60 is collectively forming the third metal film 8 onto each of the first metal film 5 and the second metal film 7 by electroless plating. Here, the third metal film 8 is a NiP-containing film. The first metal film 5, the second metal film 7, and the third metal films 8 are metal films for soldering.

(Fundamental Technique)

Figure 3:
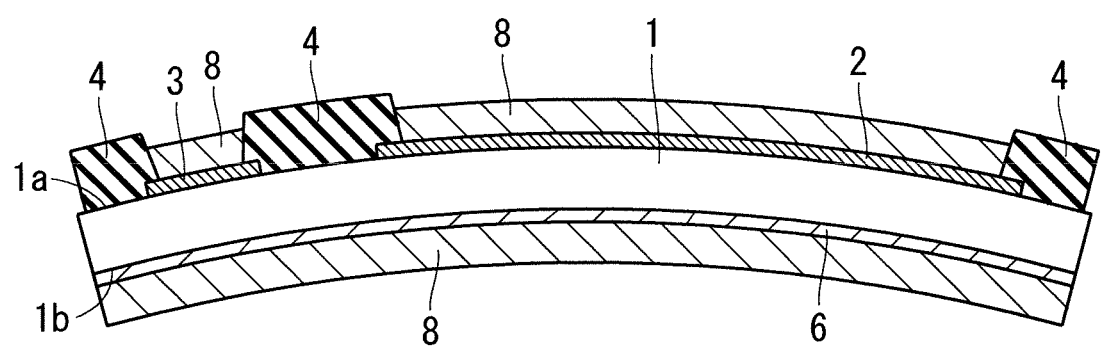
FIG. 3 is a cross-sectional view of the configuration of a semiconductor device according to a fundamental technique.

The following describes a fundamental technique, followed by effects of the method for manufacturing the semiconductor device according to the first preferred embodiment. FIG. 3 is a cross-sectional view of the configuration of a semiconductor device according to the fundamental technique. The semiconductor device according to the fundamental technique includes neither the first metal film 5 nor the second metal film 7, and is thus distinct from the semiconductor device illustrated in FIG. 1. The difference in volume between the third metal films 8 over the front surface 1a and back surface 1b of the semiconductor device according to the fundamental technique causes the semiconductor device to have an upwardly bulging shape, i.e., such a shape as to bulge toward the front surface 1a.

Effect

In the method for manufacturing the semiconductor device according to the first preferred embodiment, the ratio of the thickness t1 of the first metal film 5 to the thickness t2 of the second metal film 7 is regulated according to the rate of opening of the protective film 4. The thickness t1 of the first metal film 5 and the thickness t2 of the second metal film 7 establish the relationship of t1>t2. This enables a stress produced by the difference in thickness between the first metal film 5 and the second metal film 7 to be controlled, thereby regulating the direction and degree of warpage.

As described above, the method for manufacturing the semiconductor device according to the first preferred embodiment includes the following: depositing the first conductive film onto the one main surface of the semiconductor substrate 1 for patterning to form the first electrode 2; forming the first metal film 5 corresponding to the pattern of the first electrode 2 onto the first electrode 2; depositing the second conductive film onto the other main surface of the semiconductor substrate 1 to form the second electrode 6; forming the second metal film 7 thinner than the first metal film 5 onto the second electrode 6; and collectively forming the third metal film 8 onto each of the first metal film 5 and the second metal film 7 through electroless plating.

The method for manufacturing the semiconductor device according to the first preferred embodiment precisely controls an absolute value of the thickness t1 of the first metal film 5 and an absolute value of the thickness t2 of the second metal film 7 when the first metal film 5 and the second metal film 7 are formed through vapor deposition or sputtering. That is, the method for manufacturing the semiconductor device according to the first preferred embodiment controls the relationship of t1>t2 with high precision. Further, electroless plating forms the third metal film 8. This facilitates the formation of a metal film thicker than the first metal film 5 and the second metal film 7. Still further, the third metal film 8, formed through electroless plating, has a highly uniform thickness. In addition, the third metal film 8 is collectively formed onto each of the front surface 1a and back surface 1b of the semiconductor substrate 1. This forms a thick metal film for soldering composed of the first metal film 5 and the third metal film 8 on the front surface 1a of the semiconductor substrate 1, and at the same time, forms a thick metal film for soldering composed of the second metal film 7 and the third metal film 8 on the back surface 1b of the semiconductor substrate 1, while maintaining the precisely controlled relationship of t1>t2. Consequently, a semiconductor device is achieved that has a highly reliable junction between the first electrode 2 and the external electrode (not shown) and a highly reliable junction between the second electrode 6 and the external electrode. Further, the warpage of the semiconductor device is improved in the heat treatment before the joining of the first metal film 5 to the external electrode, thereby preventing assembly failures. Still further, electroless plating deposits a metal film thicker than that deposited through vapor deposition or sputtering at low cost.

It is difficult to establish a difference in thickness between the metal films for soldering disposed on both surfaces through plating alone. The difference can be regulated using the area of the first electrode 2 on the front surface 1a. However, such regulation limits the flexibility in designing the semiconductor device. The manufacturing method according to the first preferred embodiment facilitates, in spite of the film formation by plating, establishing the difference in thickness between the metal film for soldering (the first metal film 5 and the third metal film 8) over the front surface 1a and the metal film for soldering (the second metal film 7 and the third metal film 8) over the back surface 1b. This controls the warpage. Forming a metal film of Ni on the first electrode 2 through plating requires a pre-treatment, such as a zincate treatment when the first electrode 2 is an Al electrode. The method for manufacturing the semiconductor device according to the first preferred embodiment includes forming the third metal film 8 onto the first metal film 5 through plating. Hence, the pre-treatment, such as the zincate treatment, can be omitted. As such, the method for manufacturing the semiconductor device according to the first preferred embodiment improves the productivity of the semiconductor device.

Second Preferred Embodiment

The following describes a semiconductor device and a method for manufacturing the same, according to a second preferred embodiment. Configurations and operations similar to those in the first preferred embodiment will not be elaborated upon here.

Figure 4:
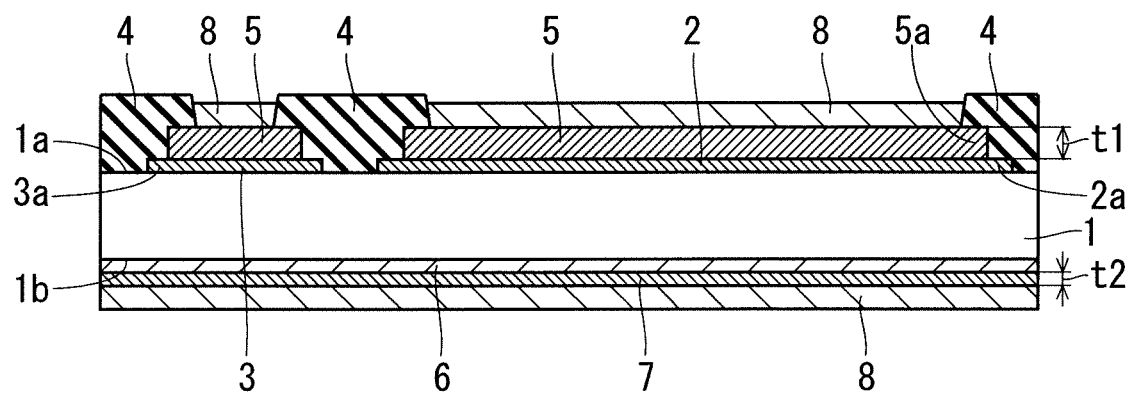
FIG. 4 is a cross-sectional view of the configuration of a semiconductor device according to a second preferred embodiment.

FIG. 4 is a cross-sectional view of the configuration of the semiconductor device according to the second preferred embodiment. The protective film 4 is provided to cover not only the end 2a of the first electrode 2 and the end 3a of the third electrode 3, but also an end 5a of the first metal film 5.

Figure 5:
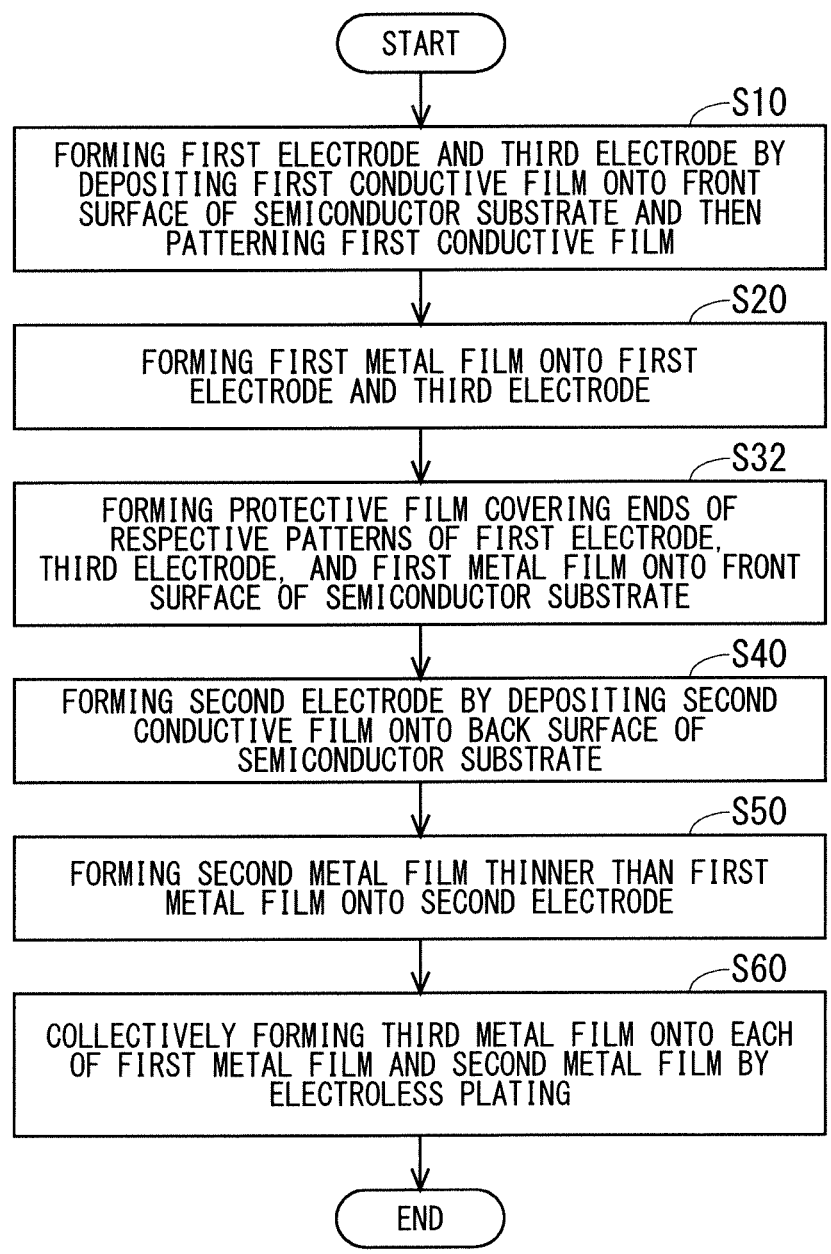
FIG. 5 is a flowchart showing a method for manufacturing the semiconductor device according to the second preferred embodiment.

FIG. 5 is a flowchart showing the method for manufacturing the semiconductor device according to the second preferred embodiment.

Step S10 is the same as that in the first preferred embodiment.

Step S20 is forming the first metal film 5 corresponding to the pattern of the first electrode 2 onto the first electrode 2, and forming the first metal film 5 corresponding to the pattern of the third electrode 3 onto the third electrode 3.

Step S32 is forming the protective film 4 covering the ends 2a, 3a, and 5a of the respective patterns of the first electrode 2, the third electrode 3, and the first metal film 5 onto the front surface 1a of the semiconductor substrate 1, i.e., one main surface of the semiconductor substrate 1.

Step S40 to step S60 are the same as those in the first preferred embodiment.

Effect

As described above, the method for manufacturing the semiconductor device according to the second preferred embodiment includes after forming the first electrode 2 and the first metal film 5, forming the protective film 4 covering the end of the pattern of the first electrode 2 and the end of the pattern of the first metal film 5 onto the one main surface of the semiconductor substrate 1.

Through this method, the protective film 4 covers the end 5a of the first metal film 5. Accordingly, the third metal film 8, although formed to cover the end 5a of the first metal film 5 in the first preferred embodiment, is formed to extend only to the end of the opening of the protective film 4 in the second preferred embodiment. Covering the end 5a of the first metal film 5 with the protective film 4 forms a region to be soldered and a region not to be soldered on a surface of the first metal film 5. The first metal film 5 and the third metal film 8 in the region to be soldered have a total thickness that is enough for the first metal film 5 and the third metal film 8 not to vanish under heat cycles. Meanwhile, the region not to be soldered prevents cracking in the first electrode 2 under the heat cycles. This improves the reliability of the semiconductor device. Further, when the first metal film 5 is made of Ni-containing metal, the Ni film, which is hard, protects a semiconductor element. Still further, the protective film 4 suppresses the end 5a of the first metal film 5, containing Ni. This improves the reliability of the semiconductor device.

Third Preferred Embodiment

The following describes a semiconductor device and a method for manufacturing the same, according to a third preferred embodiment. Configurations and operations similar to those in the first or second preferred embodiment will not be elaborated upon here.

Figure 6:
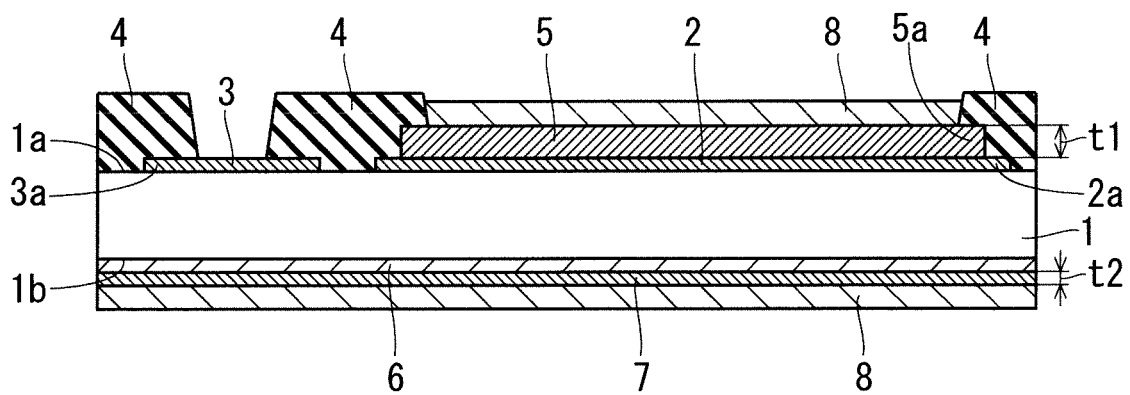
FIG. 6 is a cross-sectional view of the configuration of a semiconductor device according to a third preferred embodiment.

FIG. 6 is a cross-sectional view of the configuration of the semiconductor device according to the third preferred embodiment. In the third preferred embodiment, neither the first metal film 5 nor the third metal film 8 is disposed on the third electrode 3.

Figure 7:
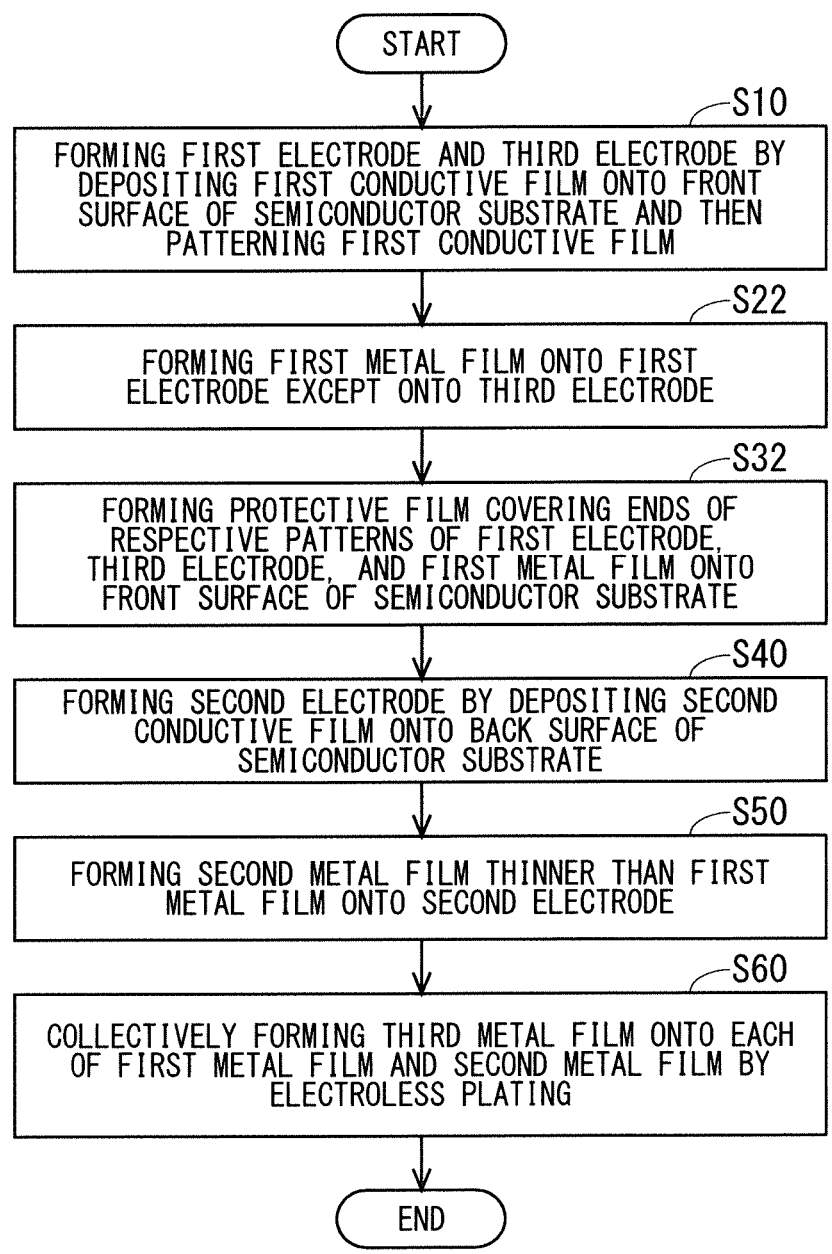
FIG. 7 is a flowchart showing a method for manufacturing the semiconductor device according to the third preferred embodiment.

FIG. 7 is a flowchart showing the method for manufacturing the semiconductor device according to the third preferred embodiment.

Step S10 is the same as that in the first preferred embodiment.

Step S22 is forming the first metal film 5 corresponding to the pattern of the first electrode 2 onto the first electrode 2 except onto the third electrode 3.

Step S32 is forming the protective film 4 covering the end 2a of the patter of the first electrode 2 and the end 5a of the pattern of the first metal film 5 onto the front surface 1a of the semiconductor substrate 1, i.e., one main surface of the semiconductor substrate 1. At this time, the protective film 4 is also formed to cover the end 3a of the pattern of the third electrode 3.

Step S40 to step S60 are the same as those in the first preferred embodiment. No first metal film 5 is formed on the third electrode 3; thus, neither is the third metal film 8.

Effect

As described above, the method for manufacturing the semiconductor device according to the third preferred embodiment includes forming the first electrode 2. Forming the first electrode 2 further includes forming the third electrode 3 spaced from the first electrode 2 onto the one main surface of the semiconductor substrate 1 by patterning the first conductive film. Further, forming the first metal film 5 includes forming the first metal film 5 except onto the third electrode 3.

A voltage signal for controlling the switching operations of a semiconductor element is applied to the third electrode 3. Accordingly, a wire is connected as an external electrode. The first electrode 2, which is exposed, achieves more favorable assembly performance of the semiconductor device than the assembly performance of the semiconductor device including the first metal film 5 and the third metal film 8.

Fourth Preferred Embodiment

The following describes a semiconductor device and a method for manufacturing the same, according to a fourth preferred embodiment. Configurations and operations similar to those in any of the first to third preferred embodiments will not be elaborated upon here.

Figure 8:
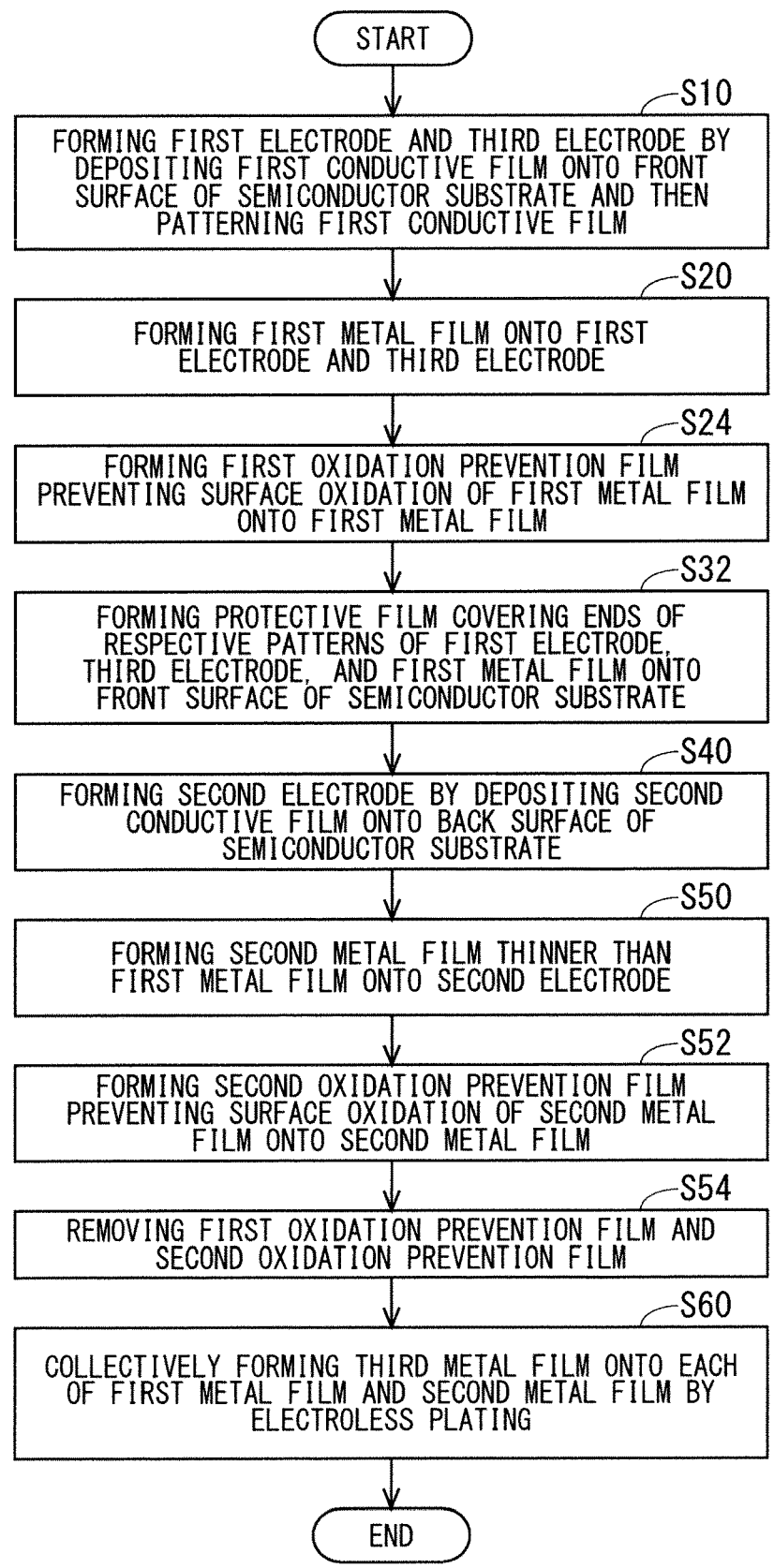
FIG. 8 is a flowchart showing a method for manufacturing a semiconductor device according to a fourth preferred embodiment.

FIG. 8 is a flowchart showing the method for manufacturing the semiconductor device according to the fourth preferred embodiment. The fourth preferred embodiment describes the method for manufacturing the semiconductor device as one example of a modified version of the method for manufacturing the semiconductor device according to the second preferred embodiment. The method according to the fourth preferred embodiment may be a modified version of the method for manufacturing the semiconductor device according to the first or third preferred embodiment.

Step S10 and step S20 are the same as those in the second preferred embodiment.

Step S24 is forming a first oxidation prevention film preventing surface oxidation of the first metal film 5 onto the first metal film 5. The first oxidation prevention film is deposited through, for instance, vapor deposition or sputtering. The first oxidation prevention film contains, for instance, Au or Ti, and other materials. The first oxidation prevention film has a thickness of the order of 10 nm to 2 µm. Step S24 is preferably subsequent to step S20.

Step S32 to step S50 are the same as those in the second preferred embodiment.

Figure 9:
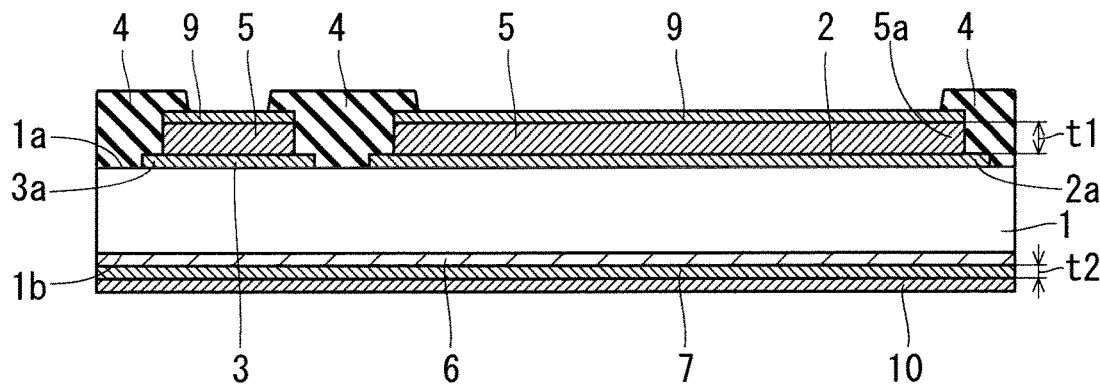
FIG. 9 is a cross-sectional view of the configuration of the semiconductor device according to the fourth preferred embodiment after first and second oxidation prevention films are formed.

Step S52 is forming a second oxidation prevention film preventing surface oxidation of the second metal film 7 onto the second metal film 7. FIG. 9 is a cross-sectional view of the structure of the semiconductor device according to the fourth preferred embodiment, after step S52. As shown in FIG. 9, the first oxidation prevention film 9 and the second oxidation prevention film 10 are respectively formed on the first metal film 5 and the second metal film 7. The second oxidation prevention film 10 is deposited through, for instance, vapor deposition or sputtering. The second oxidation prevention film 10 contains, for instance, Au or Ti, and other materials. The second oxidation prevention film 10 has a thickness of the order of 10 nm to 2 µm. Step S52 is preferably subsequent to step S50.

Figure 10:
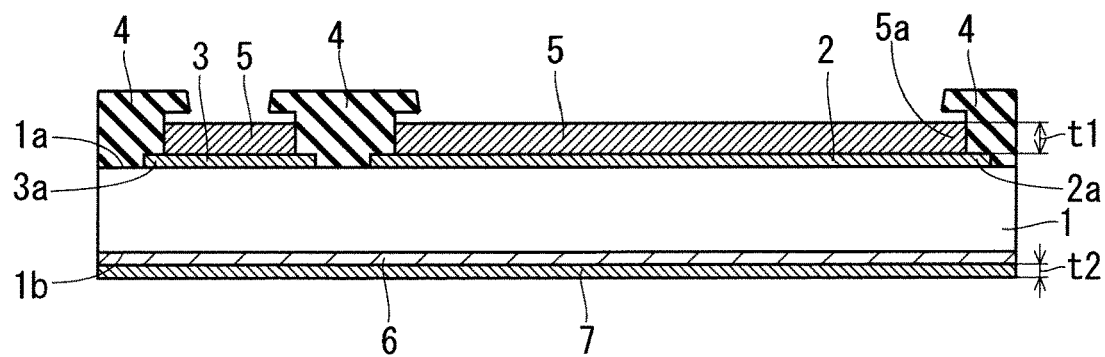
FIG. 10 is a cross-sectional view of the configuration of the semiconductor device according to the fourth preferred embodiment after the first and second oxidation prevention films are removed.

Step S54 is removing the first oxidation prevention film 9 and the second oxidation prevention film 10. FIG. 10 is a cross-sectional view of the structure of the semiconductor device according to the fourth preferred embodiment, after step S54. The first oxidation prevention film 9 and the second oxidation prevention film 10 are preferably removed immediately before subsequent step S60, i.e., immediately before the third metal film 8 is formed.

Figure 11:
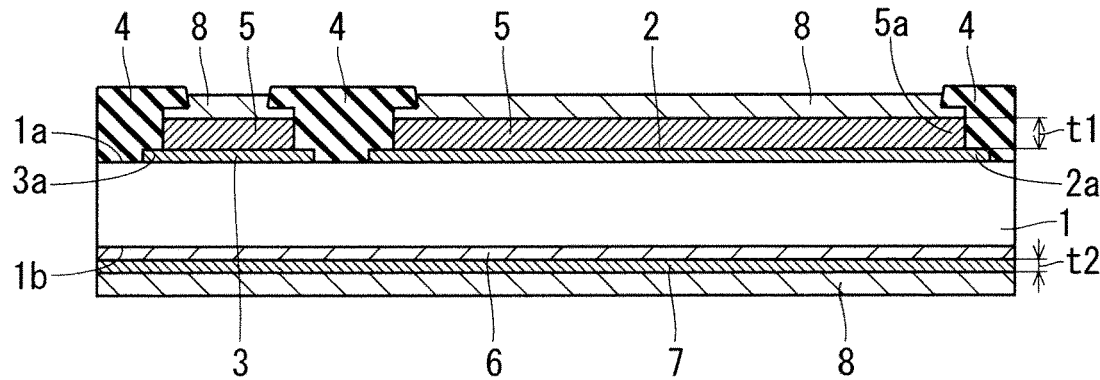
FIG. 11 is a cross-sectional view of the configuration of the semiconductor device according to the fourth preferred embodiment after a third metal film is formed.

Step S60 is the same as that in the second preferred embodiment. FIG. 11 is a cross-sectional view of the structure of the semiconductor device according to the fourth preferred embodiment, after step S60.

Effect

As described above, the method for manufacturing the semiconductor device according to the fourth preferred embodiment includes the following: after forming the first metal film 5, forming the first oxidation prevention film 9 preventing the surface oxidation of the first metal film 5 onto the first metal film 5; after forming the second metal film 7, forming the second oxidation prevention film 10 preventing the surface oxidation of the second metal film 7 onto the second metal film 7; and before collectively forming the third metal film 8 through electroless plating, removing the first oxidation prevention film 9 and the second oxidation prevention film 10.

The manufacturing method prevents the first metal film 5 and the second metal film 7 from surface oxidation. When the first metal film 5 contains Ni, for instance, the first oxidation prevention film 9 prevents a Ni oxide film, which is hard to remove, from forming on a surface of the first oxidation prevention film 9. This facilitates the subsequent plating process. The second oxidation prevention film 10 has a similar effect. As a result, the semiconductor device is manufactured at lower cost; in addition, variations in manufacture are reduced.

The preferred embodiments describe an instance where the first metal film 5, the second metal film 7, and the third metal film 8 are soldered to the external electrode. These metal films may be joined to any target through any process. For instance, each metal film may be directly joined to a wire. Alternatively, for joining with Ag instead of soldering, the semiconductor device according to each preferred embodiment has a similar effect.

The first metal film 5 and the second metal film 7, although being Ni films in each method for manufacturing the semiconductor device, may be Cu films. Further, the first electrode 2 and the second electrode 6, although being electrodes containing Al, may be electrodes containing Si or Cu. Still further, the third metal film 8 may be composed of a NiP film having a surface provided with a Au film. A similar effect is achieved in any case.

It is noted that in the present invention, the individual preferred embodiments can be freely combined, or can be modified and omitted as appropriate, within the scope of the invention. While the invention has been shown and described in detail, the foregoing description is in all aspects illustrative and not restrictive. It is therefore understood that numerous modifications and variations can be devised without departing from the scope of the invention.

What is claimed is:

1. A method for manufacturing a semiconductor device, comprising:
    forming a first electrode by depositing a first conductive film onto one main surface of a semiconductor substrate and patterning the first conductive film;
    forming a first metal film corresponding to the pattern of the first electrode onto the first electrode through vapor deposition or sputtering;
    forming a protective film, covering an end of the pattern of the first electrode and an end of a pattern of the first metal film, onto the one main surface of the semiconductor substrate, the protective film having an opening exposing a portion of the first metal film;
    forming a second electrode by depositing a second conductive film onto another main surface of the semiconductor substrate;
    forming a second metal film thinner than the first metal film onto the second electrode through vapor deposition or sputtering; and
    collectively forming a third metal film onto each of the first metal film in the opening and the second metal film by electroless plating, wherein
    in the steps of forming the first metal film and forming the second metal film, the first metal film and the second metal film are formed with respective thicknesses regulated according to an area of the opening of the protective film to reduce warping of the semiconductor substrate after the step of forming the third metal film, and
    a difference between a thickness of a first film for soldering, being the first metal film and the third metal film, and a thickness of a second film for soldering, being the second metal film and the third metal film, reduces a warpage of the substrate.

2. The method for manufacturing a semiconductor device according to claim 1, comprising
    after forming the first electrode and the first metal film, forming the protective film covering the end of the pattern of the first electrode and the end of the pattern of the first metal film onto the one main surface of the semiconductor substrate.

3. The method for manufacturing a semiconductor device according to claim 1, wherein
    forming the first electrode further includes forming a third electrode spaced from the first electrode onto the one main surface of the semiconductor substrate by patterning the first conductive film, forming the first metal film includes forming the first metal film except onto the third electrode, the semiconductor substrate includes a semiconductor element including the first electrode, the second electrode, and the third electrode, and the third electrode is an electrode to which a voltage signal for controlling a switching operation of the semiconductor element.

4. The method for manufacturing a semiconductor device according to claim 1, comprising:

after forming the first metal film, forming a first oxidation prevention film, which prevents surface oxidation of the first metal film, onto the first metal film;

after forming the second metal film, forming a second oxidation prevention film, which prevents surface oxidation of the second metal film, onto the second metal film; and before collectively forming the third metal film by electroless plating, removing the first oxidation prevention film and the second oxidation prevention film.

5. A method for manufacturing a semiconductor device, comprising:

forming a first electrode by depositing a first conductive film onto one main surface of a semiconductor substrate and patterning the first conductive film;

forming a first metal film inside the pattern of the first electrode and onto the first electrode through vapor deposition or sputtering;

forming a protective film, covering an end of the pattern of the first electrode, onto the one main surface of the semiconductor substrate, the protective film having an opening exposing a portion of the first metal film;

forming a second electrode by depositing a second conductive film onto another main surface of the semiconductor substrate;

forming a second metal film thinner than the first metal film onto the second electrode through vapor deposition or sputtering; and collectively forming a third metal film onto each of the first metal film in the opening and the second metal film by electroless plating, such that the third metal film covers an end of the pattern of the first metal film, wherein in the steps of forming the first metal film and forming the second metal film, the first metal film and the second metal film are formed with respective thicknesses regulated according to an area of the opening of the protective film to reduce warping of the semiconductor substrate after the step of forming the third metal film, and a difference between a thickness of a first film for soldering, being the first metal film and the third metal film, and a thickness of a second film for soldering, being the second metal film and the third metal film, reduces a warpage of the substrate.

* * * * *